US008700361B2

(12) United States Patent
Brown

(10) Patent No.: US 8,700,361 B2
(45) Date of Patent: Apr. 15, 2014

(54) AUTO-TRANSPOSE REPLICATION

(75) Inventor: Jeffrey Brown, West Chester, PA (US)

(73) Assignee: Bentley Systems, Inc., Exton, PA (US)

( * ) Notice: Subject to any disclaimer, the term of this patent is extended or adjusted under 35 U.S.C. 154(b) by 586 days.

(21) Appl. No.: 12/725,804

(22) Filed: Mar. 17, 2010

(65) Prior Publication Data

US 2011/0231161 A1    Sep. 22, 2011

(51) Int. Cl.
*G06F 17/50* (2006.01)

(52) U.S. Cl.
USPC .................................................... 703/1

(58) Field of Classification Search
USPC ........................................................ 703/1, 2
See application file for complete search history.

(56) References Cited

U.S. PATENT DOCUMENTS

| | | | | |
|---|---|---|---|---|
| 5,857,182 | A * | 1/1999 | DeMichiel et al. | 1/1 |
| 6,021,358 | A * | 2/2000 | Sachs | 700/98 |
| 6,512,995 | B2 * | 1/2003 | Murao | 702/167 |
| 6,810,414 | B1 * | 10/2004 | Brittain | 709/219 |
| 7,277,835 | B2 * | 10/2007 | Spitz et al. | 703/5 |
| 2001/0039487 | A1 * | 11/2001 | Hammersley et al. | 703/2 |
| 2009/0231344 | A1 * | 9/2009 | Brown | 345/441 |

OTHER PUBLICATIONS

Thompson et al., "Embarassingly parallel mesh refinement by edge subdivision," Engineering with Computers, vol. 22, No. 2, Jun. 23, 2006, pp. 75-93.
De Floriani et al., "Efficient Implementation of Multi-Triangulations," Proceedings of the IEEE Visualization 98 (VIZ'98), 1998, pp. 43-50.
Calazans et al., "Advanced Ordering and Manipulation Techniques for Binary Decision Diagrams," IEEE, 1992, pp. 452-457.
Maschno et all., "Joint registration and averaging of multiple 3D anatomical surface models," Computer Vision and Image Understanding, available online, Oct. 3, 2005,at www.elsevier.com/locite/cviu.
European Search Report for EP Patent Application No. 11 00 2060.9, mailed Oct. 17, 2012.

* cited by examiner

*Primary Examiner* — Dwin M Craig
(74) *Attorney, Agent, or Firm* — Venable LLP; Jeffri A. Kaminski; Todd R. Farnsworth

(57) ABSTRACT

A system and method for auto-transpose replication is provided. Auto-transpose replication may be considered the ability to automatically create copies of a given prototype model. Auto-transpose replication may include receiving a first list of data values and determining a total number of levels of the first list. Auto-transpose may also include creating a rectangularized list, where the rectangularized list is a rectangularized copy of the first list based on the determined total number of levels of the first list. Further, auto-transpose may include creating a return list, detecting an item at the deepest level of the rectangularized list, calculating an index trail of the item, rotating the values in the index trail, and storing the item into the return list according to the rotated index trail.

17 Claims, 12 Drawing Sheets

ALGORITHM 2. TRANSPOSE REPLICATION

Arguments:

- property type: The type of value that this input property will accept. (We already know that it's a list type.)

- value list: The value that's being assigned to the property. (We already know that it's a literal list.)

Assumptions:

- We've already passed the tests of algorithm 1, DECIDE WHETHER OR NOT "TRANSPOSE REPLICATION" SHOULD BE APPLIED.

Result:

- The value list to be assigned to the property, by way of the standard replication mechanism. This result may or may not be same as the original (given) value list.

| 1810 Calculate the following two values, by walking recursively through the value list: |
|---|
| - The deepest nest level (rank) at which there resides at least one item (of any kind) that's compatible with the property type. 1812 |
| - The deepest nest level (rank) at which there resides at least one literal list that's compatible with the property type. 1814 |

| 1820 In anticipation of calling SUPER TRANSPOSE (algorithm 3), calculate the following values, which will be passed as the arguments of that call: |
|---|
| - starting nest level = deepest rank of literal lists + 1. 1822 (We will transpose the value list starting at the first level comprising only non-literal lists.) |
| - level count = deepest rank - deepest rank of literal list. 1824 (We will transpose all levels containing non-literal lists, as a set, to the outermost level.) |

| 1830 Is starting nest level > 1 and level count > 0? | |
|---|---|
| Yes | No |
| 1840 Call SUPER TRANSPOSE (algorithm 3) to "transpose" the outer layers that include literal lists with the inner layers that don't. | 1860 Return the given value list, unchanged. |
| 1850 Return the result of calling SUPER TRANSPOSE. | |

FIG. 18

ALGORITHM 3. SUPER TRANSPOSE

Arguments:

- list: Any arbitrary list.

- starting nest level: Within the list, the number of the shallowest nest level (rank) that we want to "rotate" to the topmost level. This number is 1-based (e.g., nest level = 1 refers to the topmost level of the list).

- level count: The number of contiguous nest levels (ranks) that we want to "rotate" to the topmost level.

Result:

- A new list that contains the result of the transposition.

| |
|---|
| 1910 Determine the total number of levels that will be affected, starting from the topmost level: Number of levels = starting nest level + level count - 1. (Remember that nest levels are 1-based.) |
| 1920 Create a rectangularized copy of the list, to the number of levels that will be affected.<br><br>A "rectangularized" list is analogous to a multi-dimensional array; specifically, it's a list in which...<br><br>a. Every item has the same rank. (For any item that starts at a shallower rank, we wrap it within a sufficient number of nested lists.)<br><br>b. At each rank level except the deepest, every item (which we know is a list) contains the same number of members. (For each item that contains less members than the maximum item, we duplicate its last member a sufficent number of times.) |
| 1930 Create a new, empty list that will be the result of SUPER TRANSPOSE. |
| 1940 For every item at the deepest level of the rectangularized list: |
|     1950 Determine the index trail of that item.<br><br>    An item's "index trail" is a list of integer indices, starting at the topmost level, through which we would navigate to reach that item. For example, if an item at the deepest rank level resides at location 'list[2][0][15][4]', then that item's index trail is the list {2, 0, 15, 4}. |
|     1960 Rotate the values in the index trail in accordance with the given starting nest level.<br><br>    For example, if the index trail is {2, 0, 15, 4} and the starting nest level is 3 (1-based), the resultant index trail is {15, 4, 2, 0}. (The values 15 and 4 are rotated, as a set, to the front position.) |
|     1970 Set the item into the result list, into the "slot" indicated by the rotated index trail.<br><br>    For example, if the rotated index trail is {15, 4, 2, 0}, we set result[15][4][2][0] = item.<br><br>    As part of this process, we automatically fill the result list with nested empty lists, as necessary, so that the specified "slot" exists. |
| 1980 Return the result list as the result of SUPER TRANSPOSE. |

FIG. 19

AUTO-TRANSPOSE REPLICATION

BACKGROUND

1. Field of the Invention

The present invention relates generally to computer modeling, and more particularly to parametric modeling systems that support replication.

2. Related Art

In computer aided design (CAD) environments, a model or design, e.g. an engineering or architectural design, may be created as geometric 'elements' (e.g. lines, arcs, circles, curves, surfaces, solids, text, etc.) that may be recorded (and made persistent) in a design file (e.g. a .dgn file, .dwg file, etc.). The CAD environment may also provide a set of interactive commands to place and edit these elements. The result of using these commands is persistent, but the commands themselves are 'transient.' Knowledge of how an elements has been created or edited is not recorded in the design file.

Generative components (GC) may provide an alternative structure and technique for designing CAD elements, and using the GC elements in models or designs. GC may provide a set of features, for example, lines, curves, arcs, user-defined features etc., where each feature may have one or more "update" functions that define how the feature is generated and updated when the design is modified. GC features may be dependent on other GC features or existing elements.

Each type of GC feature may have an associated set of 'update' methods corresponding to different ways to define a feature, and various placement and modification tools and commands that may be provided with the modeling environment. A GC based system may remember how each GC feature is created and/or updated. Remembering the creation method of a GC feature may allow the GC system to re-generate or revise the feature appropriately as changes are propagated through the model.

For example, a GC circle feature may have an update function that creates a circle from a center point and a radius length. The center point of the circle may itself be a GC point, for example, the point at the intersection of two lines. If the point that defines the center of the circle moves, then the GC circle may update the circle accordingly, in this case, by moving the circle to the center's new position. Currently, every update method must be explicitly specified by the user.

In a parametric modeling system, replication may be considered the ability of the system to automatically create multiple copies of a prototype model, merely by changing one or more of the model's input properties from a single value to, for example, a list of values. A list of values could be, for example, a literal list, or a single value that is, itself, replicated.

For example, when an input property that expects a value of type T is given a value that is a list of type T (which could be a single entity of type T that is replicated), the recipient entity becomes replicated, as well. Within the recipient entity, each of its internal, component entities may be created from the corresponding component entity in the input value(s). Thus, a problem may occur when a list of values is replicated. What is needed is a way to accurately replicate a list of values.

SUMMARY

In an illustrative embodiment of the present invention a system, method and computer program product is disclosed. According to one embodiment, a computer-implemented method may include receiving a first list of data values using a computer, determining a total number of levels of the first list using the computer, creating a rectangularized list using the computer, where the rectangularized list is a rectangularized copy of the first list based on the determined total number of levels of the first list, creating a return list using the computer, detecting an item at the deepest level of the rectangularized list using the computer, calculating an index trail of the item using the computer, rotating the values in the index trail using the computer, and storing the item into the return list according to the rotated index trail using the computer.

In another embodiment of the present invention, a computer-readable medium storing computer readable program code for causing a computer to perform a method may include receiving a property type and a value list, calculating a first nest level from the value list, calculating a second nest level from the value list, calculating a starting nest level from the second nest level, calculating a level count from the first nest level and the second nest level, and rotating the level count number of members from the starting nest level to a topmost level and pushing down all intervening levels between them.

In another embodiment of the present invention, a computer-readable medium including computer-executable instructions, the medium may include one or more instructions for receiving a first list of data values, one or more instructions for determining a total number of levels of the first list, one or more instructions for creating a rectangularized list, wherein the rectangularized list is a rectangularized copy of the first list based on the determined total number of levels of the first list, one or more instructions for creating a return list, one or more instructions for detecting an item at the deepest level of the rectangularized list, one or more instructions for calculating an index trail of the item, one or more instructions for rotating the values in the index trail, and one or more instructions for storing the item into the return list according to the rotated index trail.

In another illustrative embodiment of the present invention, a parametric modeling system in a computer modeling environment may include storage and a processor. The processor may be configured to receive a first list of data values, determine a total number of levels of the first list, create a rectangularized list, where the rectangularized list is a rectangularized copy of the first list based on the determined total number of levels of the first list, create a return list, detect an item at the deepest level of the rectangularized list, calculate an index trail of the item, rotate the values in the index trail, and store the item into the return list according to the rotated index trail.

In yet another illustrative embodiment of the present invention, a parametric modeling system in a computer modeling environment may include storage and a processor. The processor may be configured to receive a property type and a value set, calculate a first nest level from the value list, calculate a second nest level from the value list, calculate a starting nest level from the second nest level, calculate a level count from the first nest level and the second nest level, rotate the level count number of members from the starting nest level to a topmost level and pushing down all intervening levels between them, and store a result of the rotate in a computer readable medium.

BRIEF DESCRIPTION OF THE DRAWINGS

FIG. 18 is a Nassi-Shneiderman diagram depicting an illustrative embodiment of a transpose replication process;

FIG. 19 is a Nassi-Shneiderman diagram depicting an illustrative embodiment of a super transpose process;

DETAILED DESCRIPTION OF EMBODIMENTS OF THE PRESENT INVENTION

An illustrative embodiment of the invention is discussed in detail below. While specific illustrative embodiments are discussed, it should be understood that this is done for illustration purposes only. A person skilled in the relevant art will recognize that other components and configurations can be used without parting from the spirit and scope of the invention.

Embodiments of the invention may provide, within a parametric modeling system, a computer program product, a system, and/or method that may automatically determine a replication method. A user may be less aware and perhaps even completely unaware of the replication methods. Rather, a replication method for a parametric modeling feature may be auto-selected.

In a parametric modeling system, replication may be considered the ability of the system to automatically create multiple copies of a prototype model, merely by changing one or more of the model's input properties from a single value to, for example, a list of values. A list of values could be, for example, a literal list, or a single value that is, itself, replicated.

For example, in one embodiment, when an input property that expects a value of type T is given a value that is a list of type T (which could be a single entity of type T that is replicated), the recipient entity may become replicated, as well. Within the recipient entity, each of its internal, component entities may be created from the corresponding component entity in the input value(s). This concept is described in more detail below.

Line Replication

Figure 1:
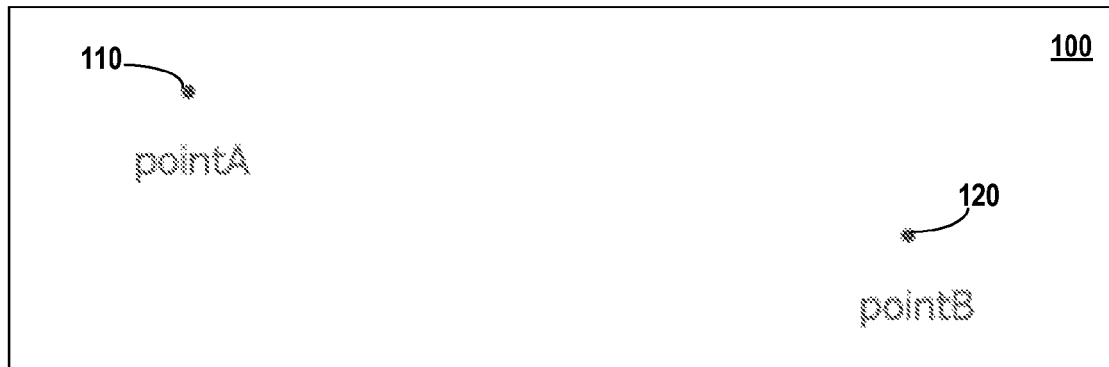
FIG. 1 depicts an example of two points in space.

FIG. 1, 100 depicts an example of two points in space 110 and 120. These points in space 110 and 120 may be represented, for example, by the values:

pointA.X=90;
pointA.Y=38;
pointB.X=120; and
pointB.Y=32.

Figure 2:
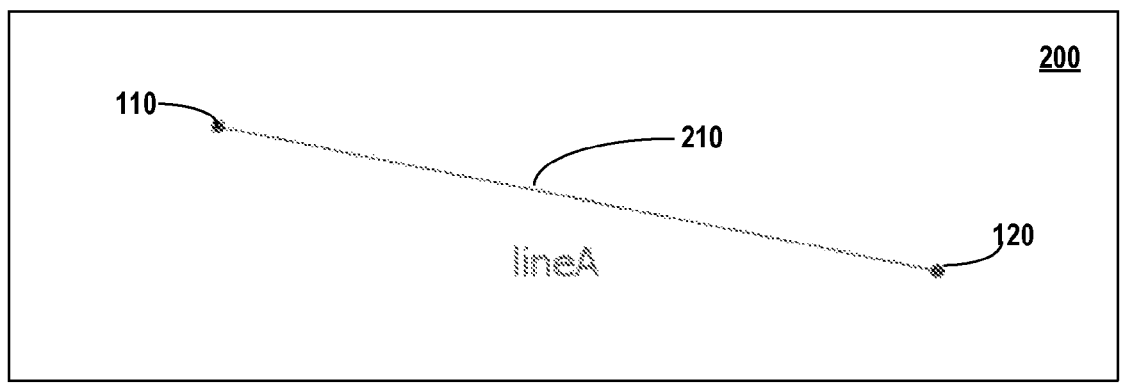
FIG. 2 depicts an example of a line connecting two points.

FIG. 2, 200 depicts an example of a line 210 connecting the two points 110 and 120. This can be represented, for example, as:

lineA.StartPoint=pointA; and
lineA.EndPoint=pointB.

Figure 3:
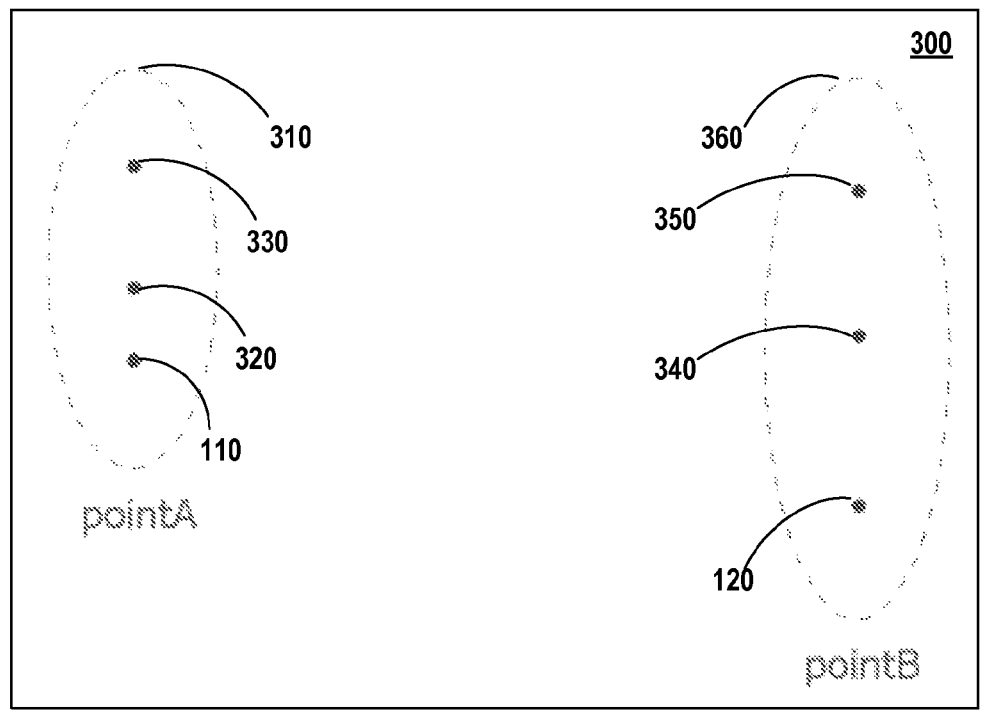
FIG. 3 depicts an example of a replication of two points.

FIG. 3, 300 depicts an example of replication of two points 110 and 120. Replication of each point may be accomplished through assigning a list of numbers (instead of just a single number) to any of the point's properties. For example:

pointA.X=90;
pointA.Y={38, 41, 46};
pointB.X=120; and
pointB.Y={32, 39, 45}.

As shown in FIG. 3., in this embodiment, when the point 110 is replicated it may be represented by the list of points pointA 310, specifically point 110 (90, 38), point 320 (90, 41), and point 330 (90, 46). When the point 120 is replicated it may be represented by the list of points pointB 360, specifically point 120 (120, 32), point 340 (120, 39), and point 350 (120, 45).

Figure 4:
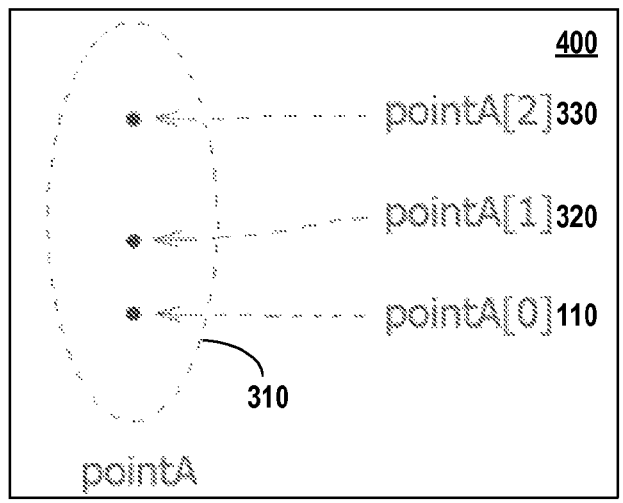
FIG. 4 depicts an example of a detailed replication of a point.

FIG. 4, 400 depicts an example of a detailed replication of point 110. In this embodiment, whenever a geometric entity (such as point 110) is replicated, each of its internal, component entities 110, 320, 330 can be accessed by indexing into the top-level entity. For example, point (90, 38) 110 may be accessed by pointA[0]; point (90, 41) 320 may be accessed by pointA[1]; and point (90, 38) 330 may be accessed by pointA[2].

Figure 5:
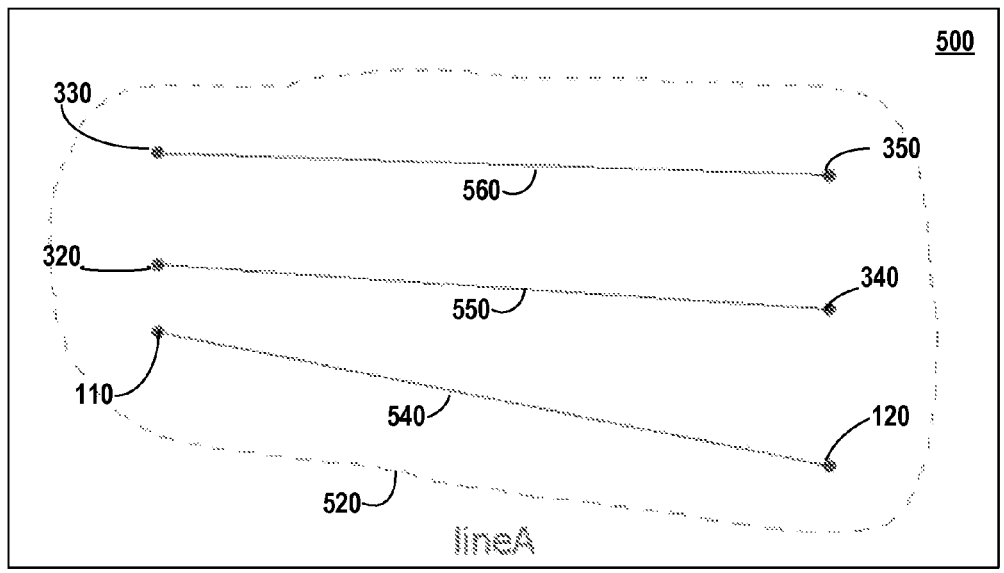
FIG. 5 depicts an example of lines drawn between replicated points.

FIG. 5, 500 depicts an example of lines 540, 550, 560 drawn between replicated list of points 310 (including 110, 320, 330) and replicated list of points 360 (including 120, 340, 350). The list of lines may be considered lineA 520. These lines may be represented by, for example:

lineA.StartPoint=pointA; and
lineA.EndPoint=pointB.

Where lineA may be a list of lines and pointA and pointB may be a list of points.

The input values of pointA 310 and pointB 360, may be expressed as they were before. However, since those values are now replicated, the line 540, itself, becomes replicated and the replicated lines may be represented as line 550 and line 560. This may also be represented by, for example:

lineA.StartPoint=pointA={pointA[0], pointA[1], pointA[2]}; and
lineA.EndPoint=pointB={pointB[0], pointB[1], pointB[2]}.

Figure 6:
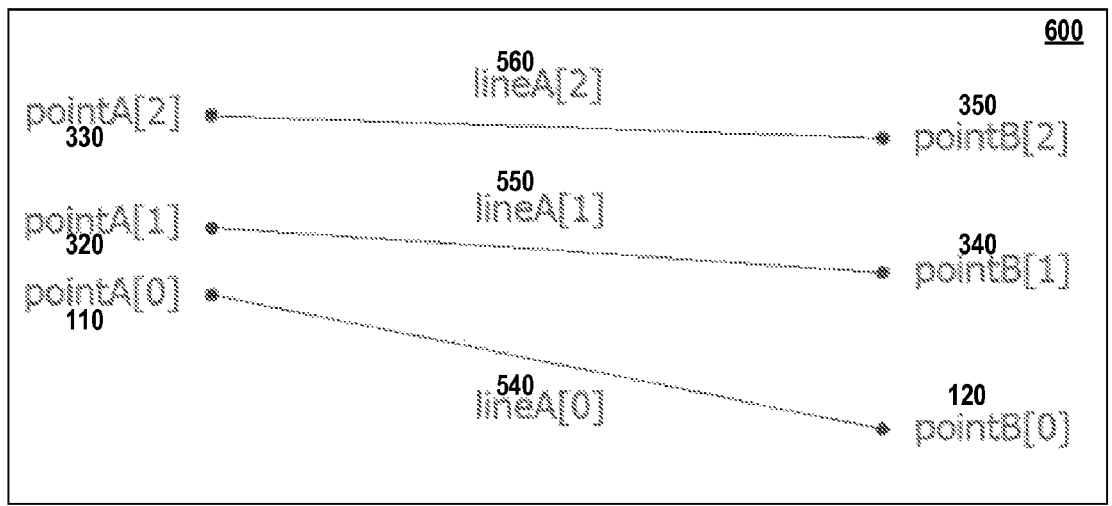
FIG. 6 depicts an example of details of lines drawn between replicated points.

The example depicted in FIG. 6, 600 details the lines 540, 550, and 560 drawn between the replicated points 110, 320, 330 and 120, 340, 350, respectfully. As shown in FIG. 6, 600 each replicated entity comprises an internal list of component entities, each of which may be accessed by indexing into the top-level entity. This may also be represented by, for example:

lineA[0].StartPoint=pointA[0];
lineA[0].EndPoint=pointB[0];
lineA[1].StartPoint=pointA[1];
lineA[1].EndPoint=pointB[1];
lineA[2].StartPoint=pointA[2]; and
lineA[2].EndPoint=pointB[2].

Curve Replication

Figure 7:
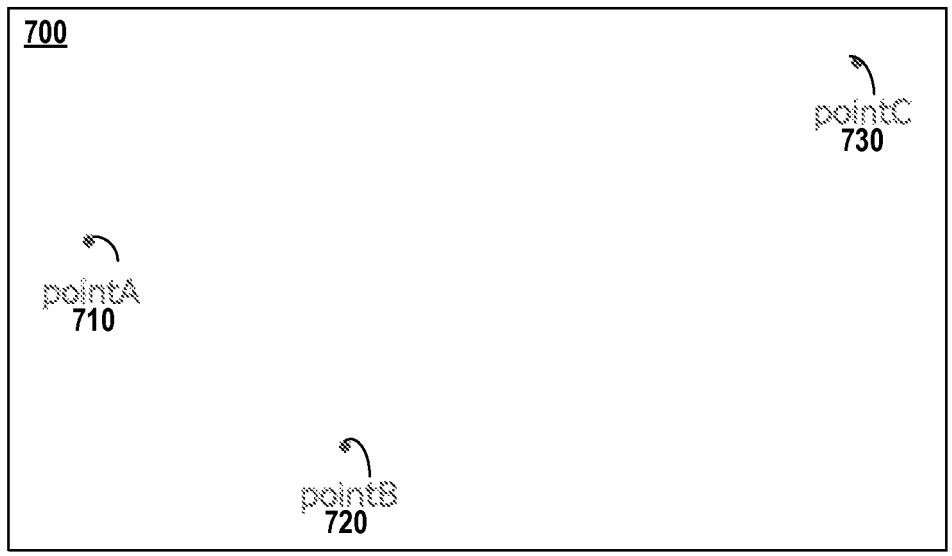
FIG. 7 depicts an example of three points in space.

FIG. 7, 700 depicts an example of three points, pointA 710, pointB 720, and pointC 730 in space. The points may be represented by:

pointA.X=90;
pointA.Y=18;
pointB.X=100;
pointB.Y=10;
pointC.X=120; and
pointC.Y=25.

Figure 8:
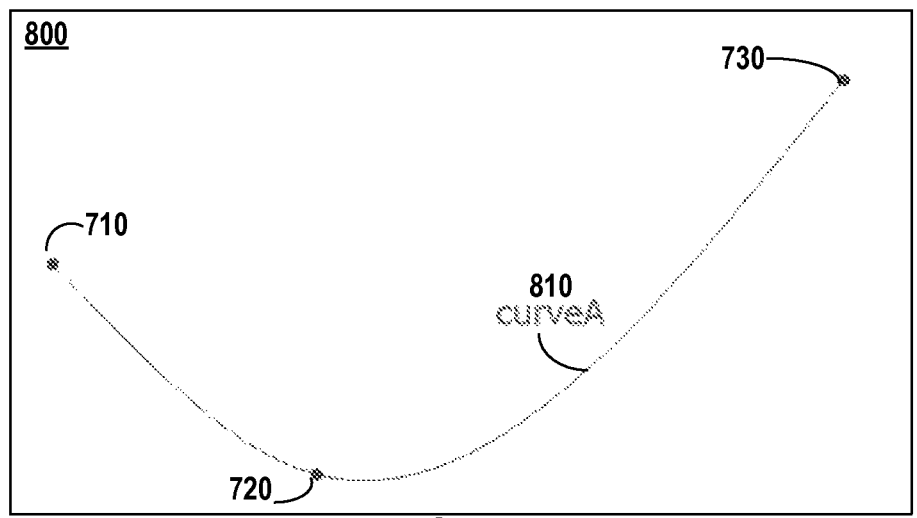
FIG. 8 depicts an example of a curved lines connecting three points in space.

FIG. 8, 800 depicts an example of a curved line curveA 810 connecting pointA 710, pointB 720, and pointC 730. For example, the points pointA 710, pointB 720, and pointC 730, may be used as input to create another geometric entity such as a curved line (e.g., a BSpline curve) as shown in curveA 810. A curved line may take one input property, which may be a list of the points through which the curve will be drawn. This may be represented by, for example:

curveA.Points={pointA, pointB, pointC}.

Figure 9:
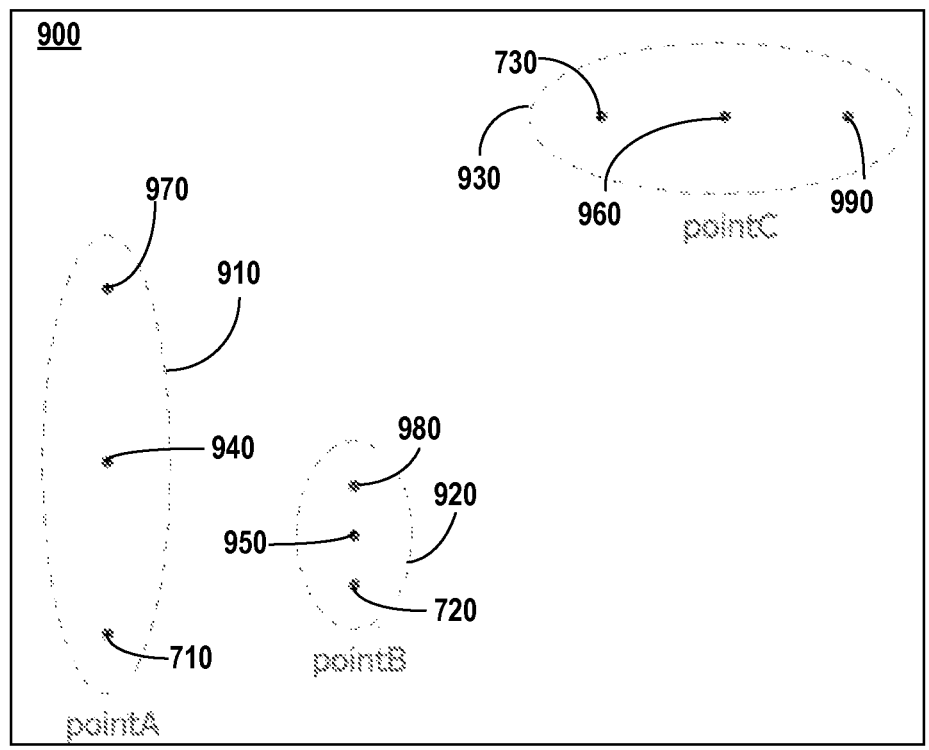
FIG. 9 depicts an example of a replication of three points.

FIG. 9, 900 depicts an example of a replication of the three points of FIG. 8, for example, pointA 710, pointB 720, and pointC 730. Replication may be achieved by assigning a list of numbers (rather than just a single number) to any of the point's properties. As shown in FIG. 3 each replicated point can be described as a list of points. In FIG. 9, for example, those lists are represented by 910 (which includes points 710, 940, and 970), 920 (which includes points 720, 950, and 980), and 930 (which includes points 730, 960, and 990). The lists of points may be represented as, for example:

pointA.X=90;
pointA.Y={18, 11, 4};
pointB.X=100;
pointB.Y={10, 8, 6};
pointC.X={120, 115, 110}; and
pointC.Y=25.

Figure 10:
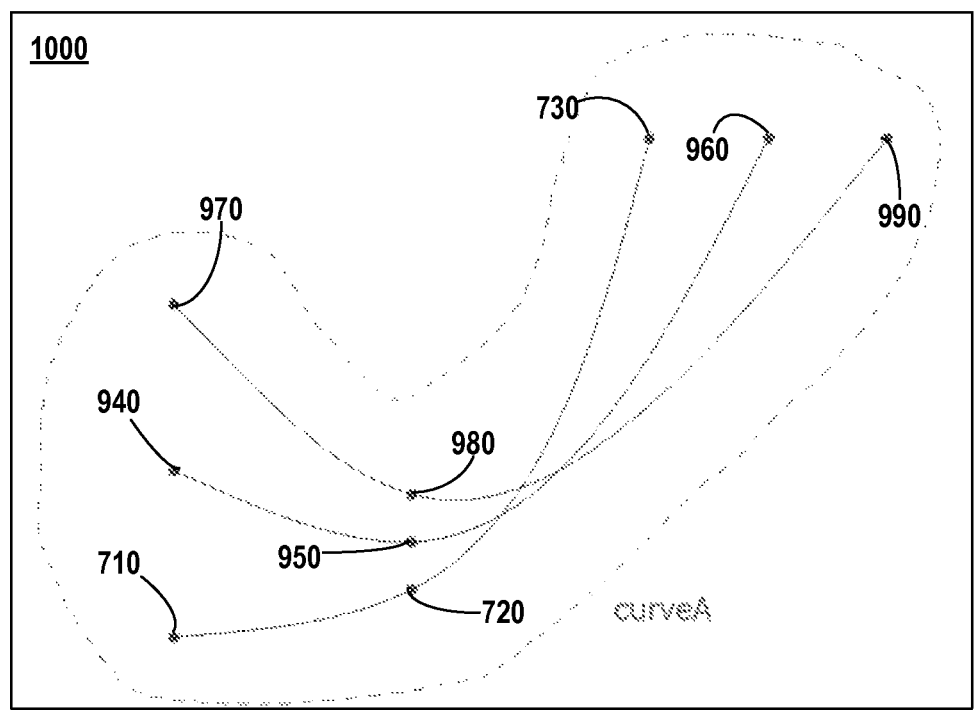
FIG. 10 depicts an example of curved lines connecting multiple replicated points.

FIG. 10, 1000 depicts an example of expected results when connecting multiple replicated points. The curve may be represented by, for example:

curveA.Points={pointA, pointB, pointC}.

The curved line may take the same input values as the line did before. Because those inputs are now replicated, the curve itself, may also be replicated resulting in three curves. However, the expected result depicted in FIG. 10 1000, without additional data transformation and manipulation, is not the actual result.

Figure 11:
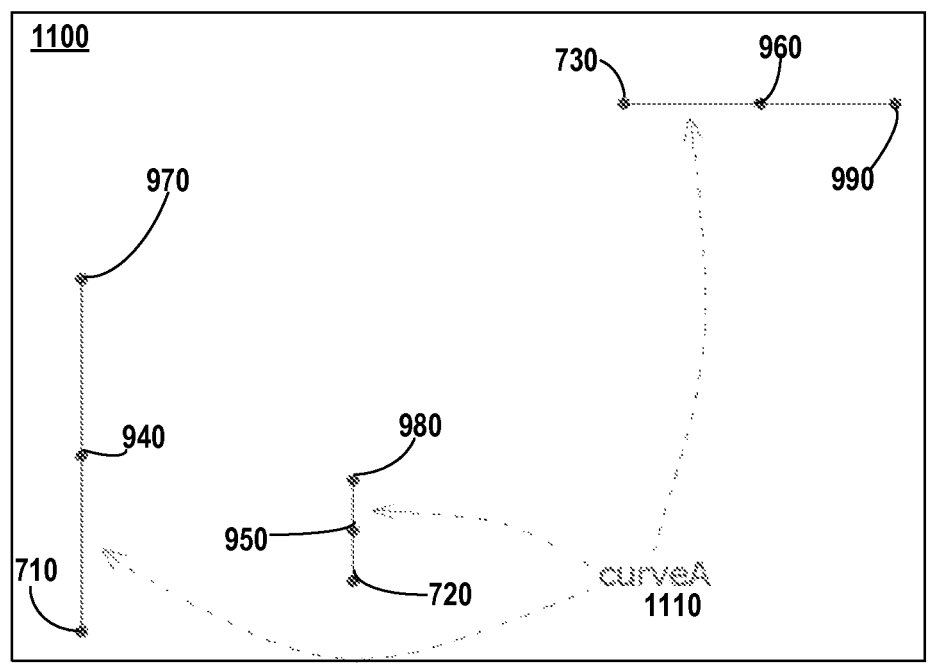
FIG. 11 depicts an example of a problem with replication of a curved line.

Instead, FIG. 11, 1100 depicts an example of the actual result of replicating a curved line. FIG. 11, 1100 is not the expected result. This problem is inherent in any parametric modeling system that supports replication and an expression language. In the assignment curveA.Points={pointA, pointB, pointC}, the input property, Points, is defined to expect a value of the type Point[ ] (that is, it expects a list of Points). Furthermore, each item in the given value list (pointA, pointB, and pointC) is, itself, a list of Points (since it is now replicated). Thus, it may be represented by, for example:

$curveA.Points = \{pointA, pointB, pointC\} =$ $\{\{pointA[0], pointA[1], pointA[2]\}, \{pointB[0], pointB[1], pointB[2]\},$ $\{pointC[0], pointC[1], pointC[2]\}\}.$ Therefore, this assignment triggers replication. When an input property that expects a value of type T is given a value that is a list of type T, the recipient entity becomes replicated, as well. In this case, type T is the type Point[ ]. When the recipient entity (curveA 810) is replicated, each of its internal, component entities is created from the corresponding component entity in the input values. And, the resulting undesirable list CurveA 1110 is created. Each internal component of curveA is assigned from the corresponding item in the given list, for example:

curveA[0].Points=pointA={pointA[0], pointA[1], pointA[2]} curveA[1].Points=pointB={pointB[0], pointB[1], pointB[2]} curveA[2].Points=pointC={pointC[0], pointC[1], pointC[2]}

Figure 12:
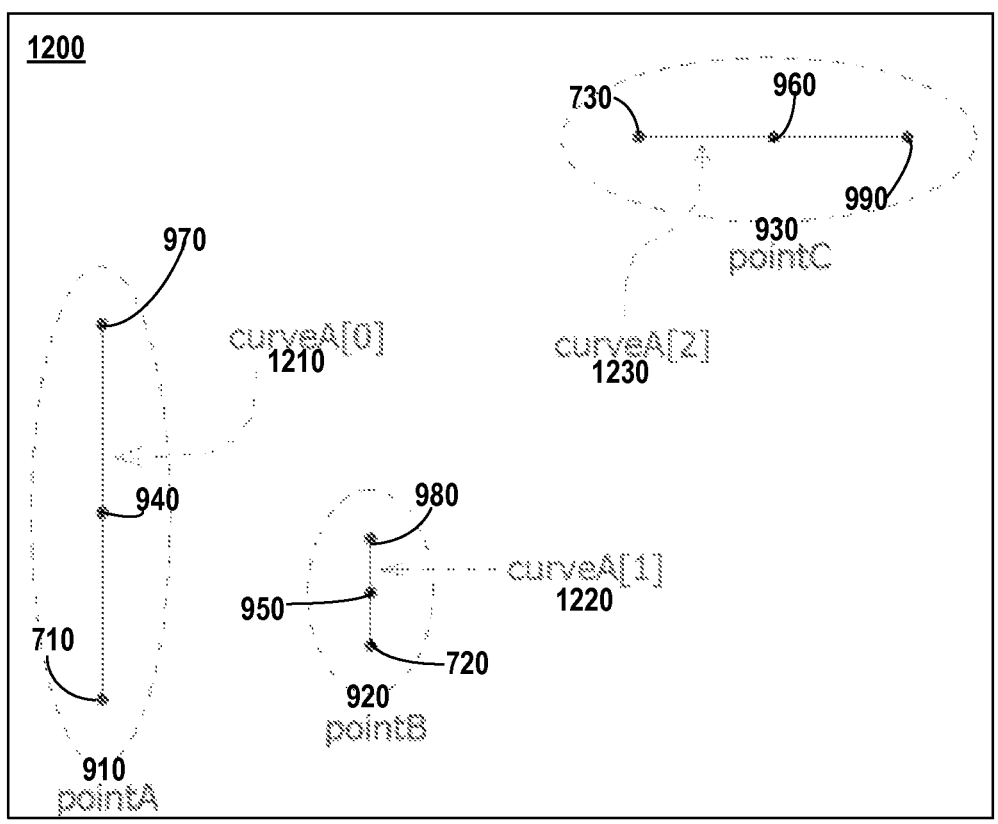
FIG. 12 depicts an example of a detailed problem with replication of a curved line.

FIG. 12, 1200 depicts an example that further details the unexpected result of replication of a curve. The list curveA[0] 1210 may include of the list of points of 910 (which includes 710, 940, and 970). The list curveA[1] 1220 may include of the list of points of 920 (which includes 720, 950, and 980). The list curveA[2] 1230 may include of the list of points 930 (which includes 730, 960, and 990). The desired result for any given curve may be a single point from each of 910, 920, and 930 (e.g., for example, 710, 720, 730; 940, 950, 960; and 970, 980, 730).

Figure 13:
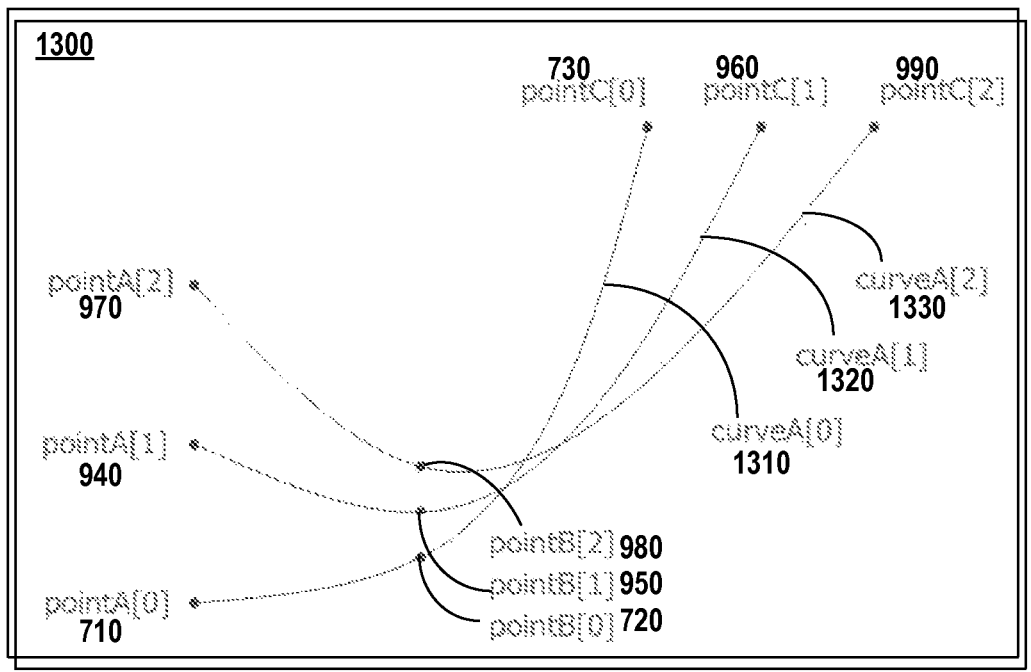
FIG. 13 depicts an example of a correctly replicated curved line.

One solution may be to implicitly transpose the input value before assigning it to the property. For example:

$curveA.Points = \{pointA, pointB, pointC\} =$ $\{\{pointA[0], pointA[1], pointA[2]\}, \{pointB[0], pointB[1], pointB[2]\},$ $\{pointC[0], pointC[1], pointC[2]\}\}$ After a transpose function $curveA.Points =$ $\{pointA, pointB, pointC\} = \{\{pointA[0], pointB[0], pointC[0]\},$ $\{pointA[1], pointB[1], pointC[1]\}, \{pointA[2], pointB[2], pointC[2]\}\}$ FIG. 13, 1300 depicts an example of the expected result of a correctly replicated curved line. The list of pointA may now contain the correct starting values of pointA[0] 710, pointA[1] 940, and pointA[2] 970. The list of pointB may now contain the correct values of pointB[0] 720, pointB[1] 950, and pointB[2] 980. The list of pointC may now contain the correct end values of pointC[0] 730, pointC[1] 960, and pointC[2] 990. The list of curveA may contain curveA[0] 1310, curveA[1] 1320, and curveA[2] 1330. The curveA[0] 1310 may now contain pointA[0] 710, pointB[0] 720, and pointC[0] 730. The curveA[1] 1320 may now contain pointA[1] 940, pointB[1] 950, and pointC[1] 960. The curveA[2] 1330 may now contain pointA[2] 970, pointB[2] 980, and pointC[2] 990. Thus, a transpose function may appropriately replicate a one-dimensional list.

Advanced Replication

The above illustrations depict the simple point replication as well as the more complicated replication of a one-dimensional list which may be represented by a curve. However, two-dimensional and multi-dimensional lists which may be represented by three-dimensional objects, may also require replication.

Figure 14:
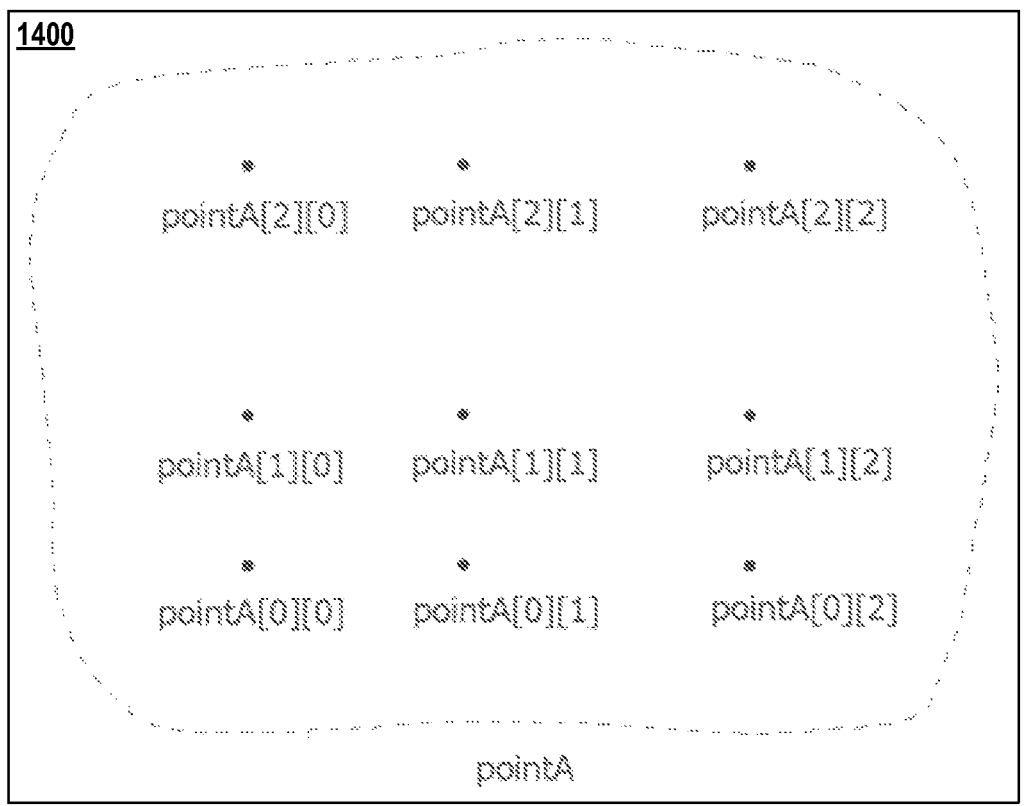
FIG. 14 depicts an example of a point replicated in two dimensions.

In, for example, CAD environments, where replication of designs may be required, several factors may need to be taken into account. For example, in one embodiment, the input's declared type (T) could be a multi-dimensional (or nested) list, rather than just a one-dimensional list. For example, if we are creating a three-dimensional surface rather than a two-dimensional curve, the Points input could be of the type Point[ ][ ], a two-dimensional (nested) list of the elemental type Point. FIG. 14, 1400, for instance, depicts an example of a point replicated in two dimensions.

In another embodiment, each item in the given value list could be replicated in more than one dimension. For example, if we define pointA as follows:

pointA.X={80, 84, 90}
pointA.Y={18, 11, 4} then pointA may be replicated in two dimensions

Furthermore, in another embodiment, an entity may be replicated in ways other than geometric coordinates (not shown). For example, an entity that displays text on the screen may be replicated by giving it a list of text values to be displayed. Therefore, there may be a large number of ways that an entity may be replicated simultaneously.

Figure 15:
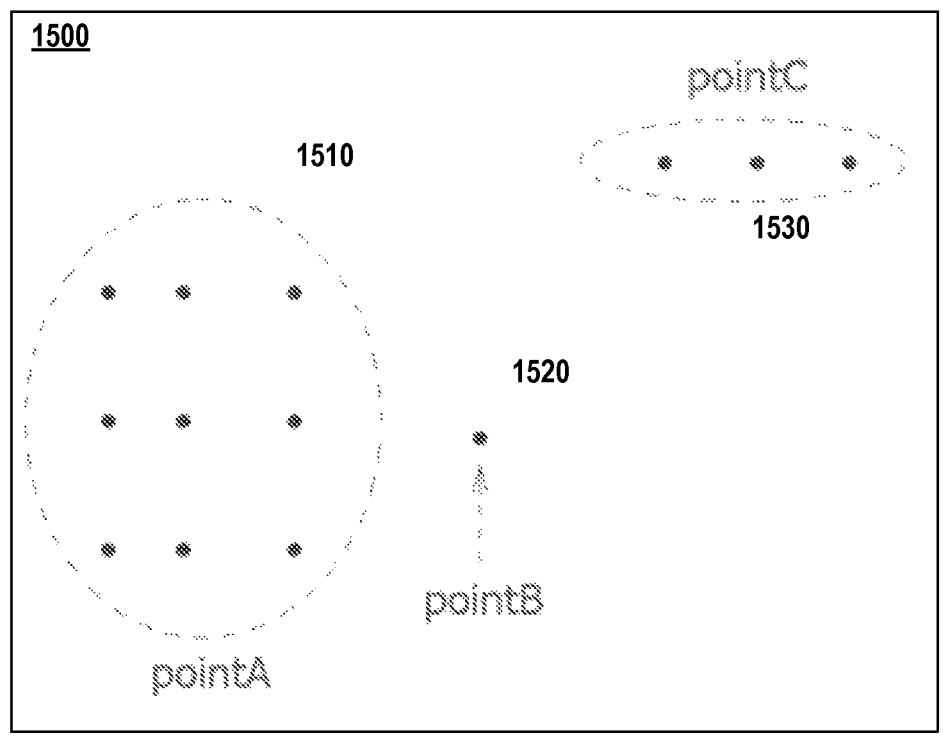
FIG. 15 depicts an example of different degrees of point replication.

FIG. 15, 1500 may depict an embodiment including different degrees of replication. For example, within the given value list, the items could have different degrees of replication. Shown as, for example:

pointA.X={80, 84, 90};
pointA.Y={18, 11, 4};
pointB.X=100;
pointB.Y=10;
pointC.X={120, 115, 110}; and
pointC.Y=25.

In this case, the list of pointA 1510 may include a multi-dimensional list. The list of point B 1520 may include a single entity. And, the list of point C 1530 may include a single dimensional list.

Figure 16:
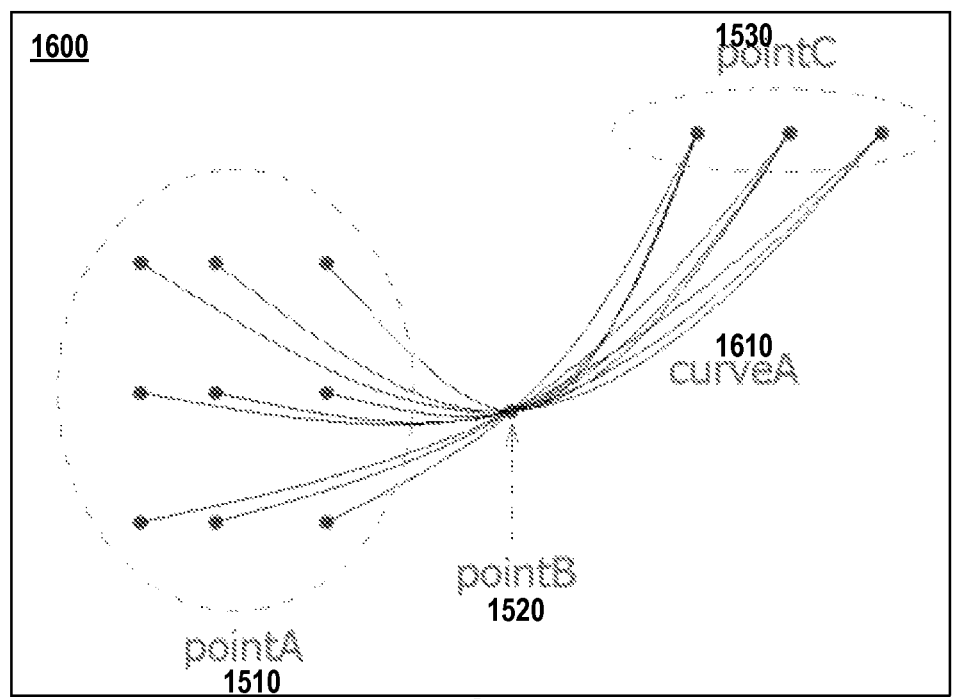
FIG. 16 depicts an example of different degrees of curve replication.

FIG. 16, 1600 depicts an embodiment of values, such as those values depicted in FIG. 15, 1500, that are properly replicated and result in curveA 1610.

Process Embodiments

Figure 17:
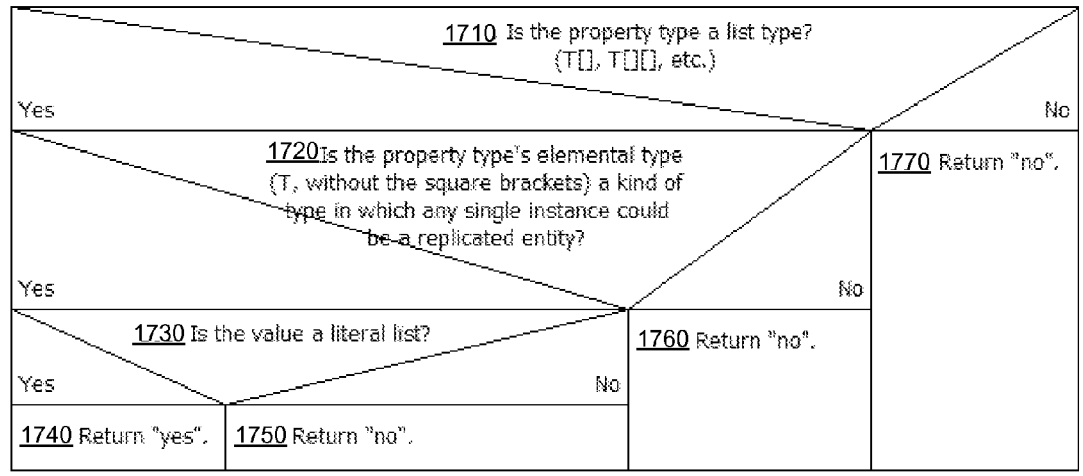
FIG. 17 is a Nassi-Shneiderman diagram depicting an illustrative embodiment of an process to decide whether or not transpose replication should be applied.

FIG. 17 is a Nassi-Shneiderman diagram depicting an illustrative embodiment which may analyze one or more parameters to determine whether or not an implementation of the transpose replication should be applied. In other words, a particular assigned value may or may not require transpose replication to be applied. The result may be a yes or no value.

For example, an embodiment may return "no" in the situation where the parameters represent a straight line. However, in the situation where the parameters represent a curved line or other advanced cases it may return "yes." The values "no" and "yes" as used in this document may be considered the Boolean (or boolean) values true and false, integer values 0 and 1, and/or may be some other value and/or property type denoting no and yes values.

In one embodiment, the flow may begin with a call to an implementation of the transpose replication. The call may contain several arguments. One argument may be a value that may be assigned to the property. Another argument may be a property type, which may be the type of value that the input value may accept. The flow may assume that the caller has previously verified that the value is compatible with the property type. Alternatively, the transpose replication may first verify that the value is compatible with the property type.

In one embodiment, once the call is made, the flow may proceed to 1710, where the property type is checked to verify that the property type is a list type (e.g., for example, T[ ], T[ ][ ], a single list, a two-dimensional list, a multiple list, etc.). One method of checking property types to verify that it is a list type is described in the following paragraphs.

In most modern programming languages, variables and/or values may be typed, that is, each variable and/or value may conform to the characteristics of a specific data type. Example data types may be 'int' (integer number), 'string,' and/or 'double' (floating-point number), etc. Each class may also be a type, for example, 'Point' and/or 'Line,' etc. Furthermore, list types may be distinct from single types. For example, the types 'Point' (a single point), 'Point[ ]' (list of points), and 'Point[ ][ ]' (two-dimensional list of points) may be distinct from one another.

To represent types internally, an internal class named GCType may be used, for example. Thus, there may be a GCType instance that represents the expression language's 'int' type, and another GCType instance that represents the expression language's 'Point' type, and so on.

Each feature property, such as, for example, 'Point.X' or 'Curve.Points,' may include an internal field that contains a reference to the GCType instance that represents the property's language-level type. So, for example, if the property 'Curve.Points' is of the type 'Point[ ]' (list of points), then, internally, that property may hold a reference to the GCType instance that represents the language's 'Point[ ]' type.

By, for example, examining the stored GCType reference on a property, the system may be able to determine whether or not the variable is a list type. The GCType class may include a "flag" (e.g., for example, a Boolean field) that indicates whether or not the language-level type that it represents is a list type.

If, in 1710, it is determined that the property type is not a list type, then flow may proceed to 1770 and the call may return no. If the property type is a list type then the flow may proceed to 1720.

In 1720, the elemental type of the property type (e.g., for example, in T[ ], the T without the square brackets) may be checked, as described below, to verify that it is a kind of type in which a single instance could be a replicated entity (e.g., for example, is the elemental type replicatable). The following paragraphs illustrate an exemplary method of determining if the property type is a kind of type in which a single instance could be a replicated entity.

If, for example, a GCType instance represents a list type, then it may include a reference to the GCType instance that represents that list type's "elemental" type, that is, the type of the fundamental objects that may be stored in the list. For example, consider the GCType instances that represent the language types 'Point[ ],' 'Point[ ][ ],' and 'Point[ ][ ][ ]' (one-, two-, and three-dimensional lists of points, respectively). For all three of those types, the corresponding "elemental" type is 'Point.'

Furthermore, every GCType instance may include a "flag" (e.g., for example, a Boolean field) denoting whether or not the corresponding language-level type is a replicatable type, that is, whether a single instance of that type could represent a list of instances. For example, all of the geometric types, such as 'Point,' 'Line,' and 'Curve,' may be replicatable types. Meanwhile, lower-level types such as 'int' and 'string' may not be replicatable types. For example, a type of Point[ ][ ] has an elemental type of point and, thus, is replicatable.

To test whether the elemental type of a property is a kind of type in which a single instance could be a replicated entity, the following steps may be performed:

a. Retrieve the GCType reference that is stored on the property. Then, from that GCType, retrieve the elemental GCType reference.

b. On that elemental GCType instance, read the flag that denotes whether the GCType represents a language-level type that is a replicatable type (e.g., any single instance of that type could be a replicated entity).

If the elemental type is not replicatable (i.e., int, string, etc.), then the flow may proceed to 1760 and the call may return no. If the elemental type is replicatable (i.e., point, line, curve, etc.), then the flow may proceed to 1730.

In 1730, the value may be checked, as described below, to verify that it is a literal list. The following paragraphs illustrate a method of determining if the value is a literal list.

When, for example, the expression language processes a literal, user-defined list, such as {38, 41, 46}, the expression language records that list into an internal class named GCObjectList. The GCObjectList may be used for many purposes, including literal lists. However, the GCObjectList may include a "flag" (e.g., for example, a Boolean field) that may indicate whether or not it was formulated from a literal list in the expression language.

Testing whether a value is a literal list may include:
  a. Testing whether the value is of an internal type (e.g., for example, GCObjectList) that could contain a literal list.
  b. Further examining that value to see whether it indicates that it actually was constructed from a literal list.

As a GCObject value may be assigned from one variable to another, or passed into or out of function calls, etc., the list contents may be copied from one GCObject to another. During that copying process, the value of the "literal list flag" is copied, as well. Thus, even if the test for whether the value is a literal list occurs at a much different time and place than when the literal list was originally constructed, a system may be able to make the correct evaluation.

If the value is not a literal list, the flow may proceed to 1750 and the call may return no. If the value is a literal list, the flow may proceed to 1740 and the call may return yes.

FIG. 18 is a Nassi-Shneiderman diagram depicting an illustrative embodiment of a transpose replication process. In one embodiment, this process may only be called if it is determined that a transpose replication process should be applied. This process may perform an appropriate "transposition" (e.g., for example, an "index rotation") on a value, such that the subsequent application of the replication mechanism provides for proper replication of the value and/or values (e.g., for example, the expected replication results may occur). Essentially, in one embodiment, this process may transpose the outer layers of the value list that contain literal lists, with the inner layers that do not contain literal lists.

In one embodiment, this process may accept several arguments. One argument accepted may be a value list, which may be the value assigned to the property. For example, the value list may be a literal list. Another accepted argument may include a property type which may be the type of value that the input property may accept. For example, this may be a list type.

In one embodiment, once a call is made, the flow may begin at 1810. In 1810, the value list may be examined to calculate several different values (e.g., the calculations performed at 1812 and 1814) by, for example, recursively traversing the value list. In 1812, a value may be calculated to determine the deepest nest level or rank at which there resides at least one item, of any kind, that is compatible with the property type. In 1814, a value may be calculated to determine the deepest nest level or rank at which there resides at least one literal list that is compatible with the property type. From 1810, 1812, and/or 1814 the flow may continue to 1820.

In 1820, several values may be calculated and the calculated values may be passed to another process such as that described in FIG. 19. In 1822, a starting nest level may be calculated which may include the value of the deepest nest level of literal lists (e.g., for example, the value calculated in 1814) plus one. Since the deepest level where there exists at least one literal list may have been calculated, each subsequent level deeper may include only non-literal lists. Thus, the calculation in 1822, may allow the process to transpose the value list starting at the first level comprising only non-literal lists. In 1824, a level count may be calculated which may include the deepest nest level or rank at which there resides at least one item that is compatible with the property type (e.g., for example, the value calculated in 1812) subtracted by the value of the deepest nest level of literal lists (e.g., for example, the value calculated in 1814). The calculation in 1824, may allow the process, in a future step, to transpose all levels containing non-literal lists, as a set, to the outermost level. From 1820, 1822, and/or 1824 the flow may continue to 1830.

In 1830, a calculation may be done to verify that the starting nest level (e.g., for example, the value calculated in 1822) is greater than one and that the level count (e.g., for example, the value calculated in 1824) is greater than zero. If the starting nest level is greater than one and the level count is greater than zero than flow may proceed to 1840. If the starting nest level is not greater than one and/or the level count is not greater than zero than flow may proceed to 1860. In 1860, the value list may be returned unchanged.

In 1840, another process (e.g., for example, a super transpose process) may be called which may transpose the outer layers of the value list that include literal lists with the inner layers that do not include literal lists. From 1840, flow may move to 1850. In 1850, the result of the process from 1860 (e.g., for example, the result of calling super transpose) may be returned.

FIG. 19 is a Nassi-Shneiderman diagram depicting an illustrative embodiment of a super transpose process. In one embodiment, this process may be called from FIG. 18 step 1860. In another embodiment the super transpose process may be a subroutine of the transpose replication process (e.g., for example, the process depicted in FIG. 18). The super transpose process may be considered a standard transpose operation (e.g., for example, transpose levels 1 and 2 of a two-dimensional collection). In another embodiment, the super transpose process may provide additional features such as handling a list that comprises more than two dimensions, allowing transposition to begin at any nest level, and/or the transposition may comprise any number of nest levels. The process may be considered index rotation as well as transposition.

In one embodiment, this process may accept several arguments. One argument may be a list. Another argument may be the starting nest level within a given list. The starting nest level may correspond to the number of the shallowest nest level and/or rank that may be rotated to the topmost level. This number may be 1-based, for example, nest level 1 may refer to the topmost level of the list. Another argument may include a level count. The level count may be the number of contiguous nest levels and/or ranks that may be rotated to the topmost level. The result of this process may be a new list that contains the result of the transposition and/or index rotation.

In one embodiment, once a call is made, the flow may begin at 1910. In 1910, the total number of affected levels may be determined by computing the starting nest level argument plus the level count argument minus 1 (1 is subtracted in the situation where the nest levels are 1-based). Thus, in one embodiment, number of levels=starting nest level+level count−1. From 1910 flow may move to 1920.

In 1920, a rectangularized copy of the list may be created based on the number of affected levels that may have been determined in 1910. In other words, a rectangularized list may be created based on the values in the list and the number of affected levels. A rectangularized list may be analogous to a multi-dimensional array where:

(a) every item may have the same rank. Thus, any item that starts at a shallower rank may be wrapped within a sufficient number of nested lists; and
(b) at each rank level, except the deepest, every item (all items may be of list type) contains the same number of members. Thus, for each item that contains fewer members than the item with the maximum number of members, the number of members is increased to equal the number of members in the item with the maximum number of members. One method to increase the number of members is, for example, to duplicate the last member a sufficient number of times.

From 1920, the flow may continue to 1930.

In 1930, a new, empty list may be created. After creation, this list may be populated with the resulting return values from this process (e.g., for example, super transpose). From 1930, flow may continue to 1940.

In 1940, the flow may process every item at the deepest level of the rectangularized list and for each of these items the flow may move to 1950, after processing every item at the deepest level of the rectangularized list, the flow may move to 1980.

In 1950, an index trail may be determined for the given item. An index trail for an item may be a list of integer indices from the topmost level to the item. For example, if an item at the deepest rank level resides at location list_value[6][54][3][21] than the index trail for the item may be the list {6, 54, 3, 21}. From 1950, flow may move to 1960.

In 1960, the values in the index trail may be rotated in accordance with the given starting nest value. For example, if the index trail is {2, 0, 15, 4} and the starting nest level is 3 (1-based), the resultant index trail may be {15, 4, 2, 0}. In this case, the values 15 and 4 are rotated, as a set, to the front position. For each item in the original list, this operation may place the object into its corresponding location in the resultant, super-transposed list. This function may take a multi-dimensional list of values and return a new list having the same number of dimensions, and containing the same values, but with the values' indices "rotated" such that an item at coordinates [a, b, . . . , m, n] in the original list, for example, may now be located at coordinates [m, n, a, b, . . . ] in the resultant list.

This may be equivalent to transposing the values in a matrix, for example in a two-dimensional list, an item at coordinates [x, y] is now at coordinates [y, x]. In another example, a three-dimensional list, which may be conceptualized as a three-dimensional rectangular grid in space, the effect of super-transpose may be to rotate the values within that three-dimensional rectangular grid in space. Thus, an item at coordinates [x, y, z] is now at coordinates [z, x, y]. Therefore, the process may be considered an index rotation, not an index reversal. Furthermore, this process may extend and generalize the index rotation concept to lists of any number of dimensions, rotating the indexes in any number of ways. This operation performs the actual rotation of the index trail in 1960.

From 1960 flow may move to 1970. In 1970, the item may be set into the result list in the position (or slot) indicated by the rotated index trail. For example, if the rotated index trail is {15, 4, 2, 0}, then result_list[15][4][2][0]=item. If needed, the result list may be filled with nested empty lists so that the specified position (or slot) exists.

Once every item at the deepest level of the rectangularized list has been processed by 1950, 1960, and 1970, flow may then move to 1980. In 1980, the result list may be returned as the result of the call to this process (e.g., for example, super transpose process).

In the above examples and throughout this document the usage of the term "list" may be general and are not limited to a particular data structure, a particular set of classes, and/or particular storage technique. The term "list" may simply refer to a structured collection of items. Furthermore, the term "literal list" may refer to a list that is created by a user, using, for example, an expression language. For example, in the GenerativeComponent expression language, the user can create a literal list by using curly braces and commas.

Code examples follow:

| | |
|---|---|
| {1, 2, 3, 4, 5} | This expression may be considered a literal list. |
| {pointA, pointB, pointC} | This expression may be considered a literal list. |
| pointA | Although this expression may result in a list (because pointA might be replicated), the expression as a whole may not be a literal list. |
| Series(1, 10, 2) | Although this expression may result in a list (because the Series function may return a list), the expression as a whole may not be a literal list. |
| {5, 2, 3, 1, 4}.Sort( ) | Although this expression may include a literal list, the expression as a whole may not be a literal list. |
| Point[ ] pts = {pointA, pointB, pointC};<br>.<br>.<br>.<br>pts | In GenerativeComponents, this expression (which may be simply the name of a variable) may not count as a literal list. When a list is assigned to a variable, or returned from a user-defined function, GC may store in memory whether that list was originally created as a literal list. |

In one embodiment, literal lists may continue to be recognized as a literal list even when they are transferred from one part of the code to another.

Exemplary Script Methods list.Balance( )

This method may return a new list comprising all of the items in the given list, but "balanced" in the sense that every item in the list has the same rank. Furthermore, the balance operation may be performed recursively on every item that is, itself, a list.

For example:
{a, b, c}→Balance( )→{a, b, c}
  No effect; the original list is already balanced.
{{a, b}, {c}, {d, e}}→Balance( )→{{a, b}, {c}, {d, e}}
  No effect; the original list is already balanced.
{{a, b}, c, {d, e}}→Balance( )→{{a, b}, {c}, {d, e}}
  The item 'c' becomes wrapped in a list, so that every item has the same rank.
{{a, {b, c}}, d, {e, {f, g}}}→Balance( )→{{{a}, {b, c}}, {{d}}, {{e}, {f, g}}}
  Balance is performed recursively on the items in the inner lists.

Advanced Use

The full signature of the Balance method may be: list.Balance(optional int maximumNumberOfLevels=int.MaxValue)

The argument may specifies the maximum number of rank levels (depth) to which the Balance operation should be applied recursively. For example:
{{a, {b, c}}, d, {e, {f, g}}}→Balance( )→{{{a}, {b, c}}, {{d}}, {{e}, {f, g}}}

The default behavior is to balance to the depth of the deepest-nested member.

{{a, {b, c}}, d, {e, {f, g}}}→Balance(1)→{{a, {b, c}}, d, {e, {f, g}}}

Balance only within rank level 1. (That is, the method looks at the given list, but not intot any of its members.) This doesn't accomplish anything!

{{a, {b, c}}, d, {e, {f, g}}}→Balance(2)→{{a, {b, c}}, {d}, {e, {f, g}}}

Balance only within the outer two rank levels. (That is, the method looks at the given list and its immediate members, but no deeper.)

{{a, {b, c}}, d, {e, {f, g}}}→Balance(3)→{{{a}, {b, c}}, {{d}}, {{e}, {f, g}}}

Balance only within the outer three rank levels. (That is, the method looks at the given list, its immediate members, and their immediate members, but no deeper).

list.Transpose( )

It may be presumed that the given list may be of rank 2 or greater—that is, it is a list of lists rather than just a single-level list.

This method may return a new list comprising all of the items in the original list, but with the position of each item transposed, as in a two-dimensional matrix. This may be equivalent to "switching the rows and the columns."

In other words, for any valid index values 'i' and T, each item at location [i][j] will be at location [j][i] in the returned list:

a=list[i][j];
b=list. Transpose( )[j][i].

'a' and 'b' will always reference the same item.

Since transposition may require a balanced list (e.g., for example, a list in which every item has the same rank), the Transpose method may firstly, implicitly, call the Balance( )method to get a balanced copy of the given list.

Advanced Use

The full signature of the Transpose method is:
list.Transpose(optional int levelToBeTransposedToLevel1=2,
 optional int numberOfLevelsToTranspose=1)

The method combined with the arguments may provide for switching the rows and columns and additional list transposing functionality.

Consider, for example, a multi-ranked list (e.g., for example, a list comprised of lists that are each comprised of lists that are each comprised of lists). Suppose there are five levels of lists, total, such that to access any item at the deepest level requires five "index coordinates": list[i][j][k][l][m].

In the new list that results from the Transpose method, each item may have a different set of index coordinates, based on the parameters given to the Transpose method. The first argument, 'levelToBeTransposedToLevel1', may indicate the index-coordinate level (starting from 1) of the index coordinate that will be rotated into the first (leftmost) position in the resultant list. The second argument, 'numberOfLevelsToTranspose,' may indicate the number of index coordinates that will be rotated in the resultant list.

The default values of these arguments (e.g., for example, 2 and 1, respectively) may provide the default behavior of, for example, "switching the rows and the columns."

For example:
[i][j][k][l][m]→Transpose (3)→[k][i][j][l][m]
 The third index coordinate, 'k', is rotated into the first position.
[i][j][k][l][m]→Transpose (5)→[m][i][j][k][l]
 The fifth index coordinate, 'm', is rotated into the first position.

[i][j][k][l][m]→Transpose(3, 2)→[k][l][i][j][m]
 Starting at the third index coordinate ('k'), two coordinates ('k' and 'l') are rotated, as a set, into the first position.
[i][j][k][l][m]→Transpose (2, 3)→[j][k][l][i][m]
 Starting at the second index coordinate ('j'), three coordinates ('j', 'k', and 'l') are rotated, as a set, into the first position.

In one embodiment, the Transpose method may prior to performing other actions, implicitly call Balance(n) to get a balanced copy of the given list, where n=levelToBeTransposedToLevel1+numberOfLevelsToBeTransposed−1.

Computer System

Figure 20:
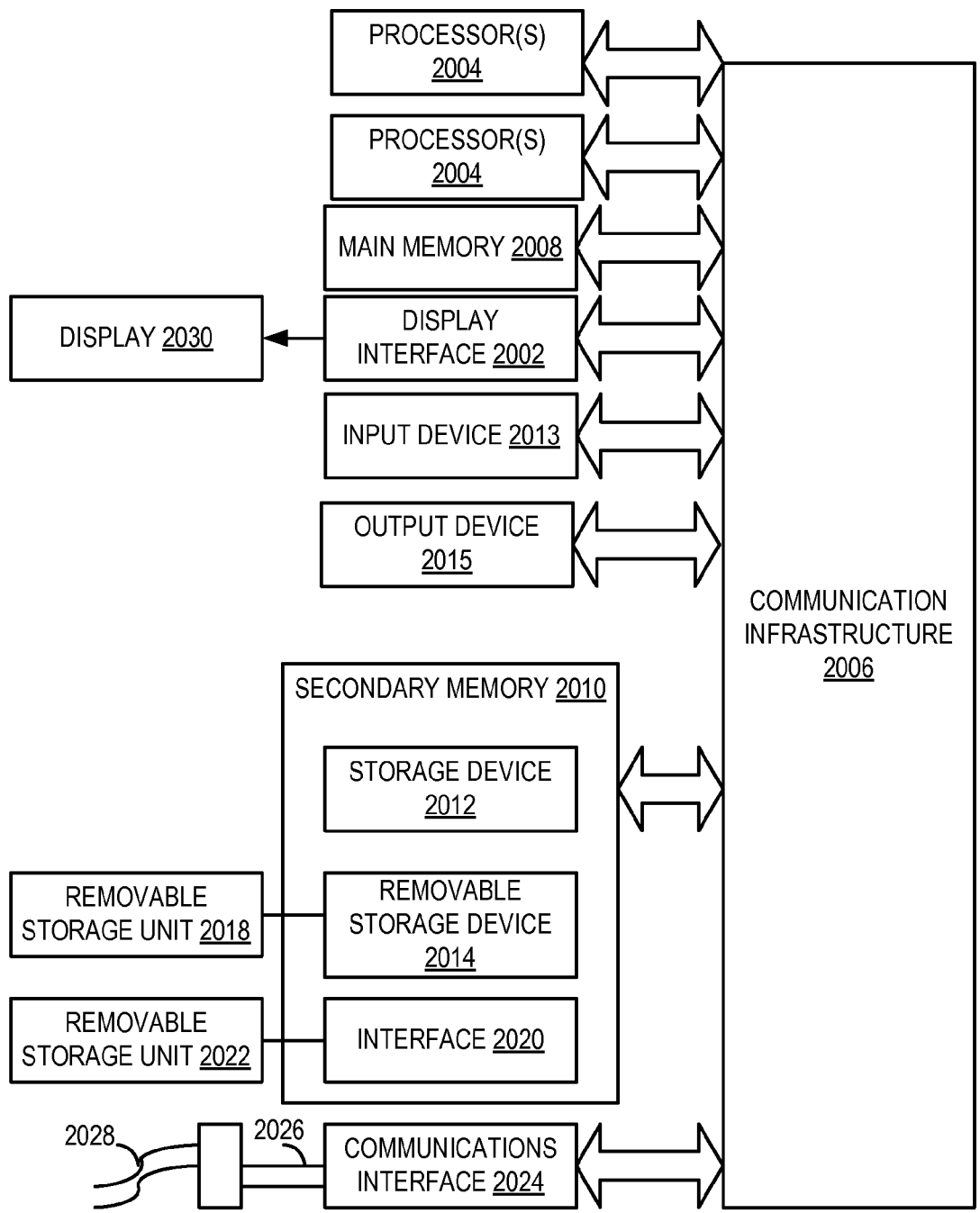
FIG. 20 depicts an illustrative embodiment of a computer.

FIG. 20 depicts an illustrative computer system that may be used in implementing an illustrative embodiment of the present invention. Specifically, FIG. 20 depicts an illustrative embodiment of a computer system 2000 that may be used in computing devices such as, e.g., but not limited to, standalone or client or server devices. FIG. 20 depicts an illustrative embodiment of a computer system that may be used as client device, or a server device, etc. The present invention (or any part(s) or function(s) thereof) may be implemented using hardware, software, firmware, or a combination thereof and may be implemented in one or more computer systems or other processing systems. In fact, in one illustrative embodiment, the invention may be directed toward one or more computer systems capable of carrying out the functionality described herein. An example of a computer system 2000 is shown in FIG. 20, depicting an illustrative embodiment of a block diagram of an illustrative computer system useful for implementing the present invention. Specifically, FIG. 20 illustrates an example computer 2000, which in an illustrative embodiment may be, e.g., (but not limited to) a personal computer (PC) system running an operating system such as, e.g., (but not limited to) MICROSOFT® WINDOWS® NT/98/2000/XP/Vista/Windows 7/etc. available from MICROSOFT® Corporation of Redmond, Wash., U.S.A. However, the invention is not limited to these platforms. Instead, the invention may be implemented on any appropriate computer system running any appropriate operating system. In one illustrative embodiment, the present invention may be implemented on a computer system operating as discussed herein. An illustrative computer system, computer 2000 is shown in FIG. 20. Other components of the invention, such as, e.g., (but not limited to) a computing device, a communications device, a telephone, a personal digital assistant (PDA), a personal computer (PC), a handheld PC, a laptop computer, a netbook, client workstations, thin clients, thick clients, proxy servers, network communication servers, remote access devices, client computers, server computers, routers, web servers, data, media, audio, video, telephony or streaming technology servers, etc., may also be implemented using a computer such as that shown in FIG. 20.

The computer system 2000 may include one or more processors, such as, e.g., but not limited to, processor(s) 2004. The processor(s) 2004 may be connected to a communication infrastructure 2006 (e.g., but not limited to, a communications bus, cross-over bar, interconnect, or network, etc.). Processor 2004 may include any type of processor, microprocessor, or processing logic that may interpret and execute instructions (e.g., for example, a field programmable gate array (FPGA)). Processor 2004 may comprise a single device (e.g., for example, a single core) and/or a group of devices (e.g., multi-core). The processor 2004 may include logic configured to execute computer-executable instructions configured to implement one or more embodiments. The instructions may reside in main memory 2008 or secondary memory 2010. Processors 2004 may also include multiple independent cores, such as a dual-core processor or a multi-core processor. Processors 2004 may also include one or more graphics processing units (GPU) which may be in the form of a dedicated graphics card, an integrated graphics solution, and/or a hybrid graphics solution. Various illustrative software embodiments may be described in terms of this illustrative computer system. After reading this description, it will become apparent to a person skilled in the relevant art(s) how to implement the invention using other computer systems and/or architectures.

Computer system 2000 may include a display interface 2002 that may forward, e.g., but not limited to, graphics, text, and other data, etc., from the communication infrastructure 2006 (or from a frame buffer, etc., not shown) for display on the display unit 2030.

The computer system 2000 may also include, e.g., but is not limited to, a main memory 2008, random access memory (RAM), and a secondary memory 2010, etc. Main memory 2008, random access memory (RAM), and a secondary memory 2010, etc., may be a computer-readable medium that may be configured to store instructions configured to implement one or more embodiments and may comprise a random-access memory (RAM) that may include RAM devices, such as Dynamic RAM (DRAM) devices, flash memory devices, Static RAM (SRAM) devices, etc.

The secondary memory 2010 may include, for example, (but is not limited to) a hard disk drive 2012 and/or a removable storage drive 2014, representing a floppy diskette drive, a magnetic tape drive, an optical disk drive, a compact disk drive CD-ROM, etc. The removable storage drive 2014 may, e.g., but is not limited to, read from and/or write to a removable storage unit 2018 in a well known manner. Removable storage unit 2018, also called a program storage device or a computer program product, may represent, e.g., but is not limited to, a floppy disk, magnetic tape, optical disk, compact disk, etc. which may be read from and written to removable storage drive 2014. As will be appreciated, the removable storage unit 2018 may include a computer usable storage medium having stored therein computer software and/or data.

In alternative illustrative embodiments, secondary memory 2010 may include other similar devices for allowing computer programs or other instructions to be loaded into computer system 2000. Such devices may include, for example, a removable storage unit 2022 and an interface 2020. Examples of such may include a program cartridge and cartridge interface (such as, e.g., but not limited to, those found in video game devices), a removable memory chip (such as, e.g., but not limited to, an erasable programmable read only memory (EPROM), or programmable read only memory (PROM) and associated socket, and other removable storage units 2022 and interfaces 2020, which may allow software and data to be transferred from the removable storage unit 2022 to computer system 2000.

Computer 2000 may also include an input device 2013 may include any mechanism or combination of mechanisms that may permit information to be input into computer system 2000 from, e.g., a user. Input device 2013 may include logic configured to receive information for computer system 21000 from, e.g. a user. Examples of input device 2013 may include, e.g., but not limited to, a mouse, pen-based pointing device, or other pointing device such as a digitizer, a touch sensitive display device, and/or a keyboard or other data entry device (none of which are labeled). Other input devices 2013 may include, e.g., but not limited to, a biometric input device, a video source, an audio source, a microphone, a web cam, a video camera, and/or other camera.

Computer 2000 may also include output devices 2015 which may include any mechanism or combination of mechanisms that may output information from computer system 2000. Output device 2015 may include logic configured to output information from computer system 2000. Embodiments of output device 2015 may include, e.g., but not limited to, display 2030, and display interface 2002, including displays, printers, speakers, cathode ray tubes (CRTs), plasma displays, light-emitting diode (LED) displays, liquid crystal displays (LCDs), printers, vacuum florescent displays (VFDs), surface-conduction electron-emitter displays (SEDs), field emission displays (FEDs), etc. Computer 2000 may include input/output (I/O) devices such as, e.g., (but not limited to) communications interface 2024, cable 2028 and communications path 2026, etc. These devices may include, e.g., but are not limited to, a network interface card, and modems (neither are labeled).

Communications interface 2024 may allow software and data to be transferred between computer system 2000 and external devices.

In this document, the terms "computer program medium" and "computer readable medium" may be used to generally refer to media such as, e.g., but not limited to, removable storage drive 2014, a hard disk installed in hard disk drive 2012, flash memories, removable discs, non-removable discs, etc. In addition, it should be noted that various electromagnetic radiation, such as wireless communication, electrical communication carried over an electrically conductive wire (e.g., but not limited to twisted pair, CATS, etc.) or an optical medium (e.g., but not limited to, optical fiber) and the like may be encoded to carry computer-executable instructions and/or computer data that embodiments of the invention on e.g., a communication network. These computer program products may provide software to computer system 2000. It should be noted that a computer-readable medium that comprises computer-executable instructions for execution in a processor may be configured to store various embodiments of the present invention. References to "one embodiment," "an embodiment," "example embodiment," "various embodiments," etc., may indicate that the embodiment(s) of the invention so described may include a particular feature, structure, or characteristic, but not every embodiment necessarily includes the particular feature, structure, or characteristic.

Further, repeated use of the phrase "in one embodiment," or "in an illustrative embodiment," do not necessarily refer to the same embodiment, although they may.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

In a similar manner, the term "processor" may refer to any device or portion of a device that processes electronic data from registers and/or memory to transform that electronic data into other electronic data that may be stored in registers and/or memory. A "computing platform" may comprise one or more processors.

Embodiments of the present invention may include apparatuses for performing the operations herein. An apparatus may be specially constructed for the desired purposes, or it may comprise a general purpose device selectively activated or reconfigured by a program stored in the device.

Embodiments may be embodied in many different ways as a software component. For example, it may be a stand-alone software package, or it may be a software package incorporated as a "tool" in a larger software product, such as, for example, a scientific modeling product. It may be downloadable from a network, for example, a website, as a stand-alone product or as an add-in package for installation in an existing software application. It may also be available as a client-server software application, or as a web-enabled software application.

While various embodiments of the present invention have been described above, it should be understood that they have been presented by way of example only, and not limitation. Thus, the breadth and scope of the present invention should not be limited by any of the above-described illustrative embodiments, but should instead be defined only in accordance with the following claims and their equivalents

What is claimed is:

1. A computer-implemented method for modeling an engineering or architectural design in a computer aided design (CAD) environment, the method comprising:
   receiving, using a computer, a first list of data values, wherein the data values represent one or more geometric elements in the CAD environment;
   determining a total number of levels of the first list using the computer;
   creating, using the computer, a rectangularized list, wherein the rectangularized list is a rectangularized copy of the first list based on the determined total number of levels of the first list;
   creating a return list using the computer;
   detecting, using the computer, an item at the deepest level of the rectangularized list;
   calculating an index trail of the item using the computer;
   rotating the values in the index trail using the computer; and
   storing, using the computer, the item into the return list according to the rotated index trail.

2. The computer-implemented method of claim 1, wherein the rotating the values in the index trail further comprises: rotating the values in the index in accordance with a received starting nest level.

3. The computer-implemented method of claim 1, wherein the method steps of calculating, rotating, and storing are performed for every item at the deepest level of the rectangularized list.

4. The computer-implemented method of claim 1, wherein the determining a total number of levels of the list further comprises determining a total number of levels of the list in accordance with a received starting nest level and a received level count.

5. A non-transitory computer-readable medium storing computer readable program code for causing a computer to perform a method for modeling an engineering or architectural design in a computer aided design (CAD) environment, the method comprising:
   receiving a property type and a value list, wherein the value list represents one or more geometric elements in the CAD environment;
   calculating a first nest level from the value list;
   calculating a second nest level from the value list;
   calculating a starting nest level from the second nest level;
   calculating a level count from the first nest level and the second nest level; and
   rotating the level count number of members from the starting nest level to a topmost level and pushing down all intervening levels between them.

6. The non-transitory computer-readable medium of claim 5, wherein the calculating the first nest level from the value list further comprises:
   traversing recursively through the value list to determine a deepest nest level at which there resides an item that is compatible with the property type.

7. The non-transitory computer-readable medium of claim 5, wherein the calculating the second nest level from the value list further comprises:
   traversing recursively through the value list to determine a deepest nest level at which there resides a literal list that is compatible with the property type.

8. The non-transitory computer-readable medium of claim 5, wherein the calculating the starting nest level from the second nest level further comprises:
   adding one to the second nest level.

9. The non-transitory computer-readable medium of claim 5, wherein the calculating the level count from the first nest level and the second nest level further comprises:
   subtracting the second nest level from the first nest level.

10. The non-transitory computer-readable medium of claim 5, further comprising:
    determining the starting nest level is greater than one; and
    determining the level count is greater than zero.

11. A non-transitory computer-readable medium comprising computer-executable instructions for modeling an engineering or architectural design in a computer aided design (CAD) environment, the medium comprising:
    one or more instructions for receiving a first list of data values, wherein the data values represent one or more geometric elements in the CAD environment;
    one or more instructions for determining a total number of levels of the first list;
    one or more instructions for creating a rectangularized list, wherein the rectangularized list is a rectangularized copy of the first list based on the determined total number of levels of the first list;
    one or more instructions for creating a return list;
    one or more instructions for detecting an item at the deepest level of the rectangularized list;
    one or more instructions for calculating an index trail of the item;
    one or more instructions for rotating the values in the index trail; and
    one or more instructions for storing the item into the return list according to the rotated index trail.

12. The non-transitory computer-readable medium of claim 11, wherein the one or more instructions for calculating, rotating, and storing are performed for every item at the deepest level of the rectangularized list.

13. A parametric modeling system for modeling an engineering or architectural design in a computer aided design (CAD) environment, the system comprising:
    a non-transitory storage; and
    one or more processors configured to:
       receive a first list of data values, wherein the data values represent one or more geometric elements in the CAD environment;
       determine a total number of levels of the first list;
       create a rectangularized list, wherein the rectangularized list is a rectangularized copy of the first list based on the determined total number of levels of the first list;

create a return list;
detect an item at the deepest level of the rectangularized list;
calculate an index trail of the item;
rotate the values in the index trail; and
store the item into the return list according to the rotated index trail.

14. The parametric modeling system of claim 13, wherein the calculate, rotate, and store are performed for every item at the deepest level of the rectangularized list.

15. A parametric modeling system for modeling an engineering or architectural design in a computer aided design (CAD) environment, the system comprising:
a non-transitory computer readable medium storage to hold one or more geometric elements in the CAD environment; and
one or more processors configured to:
receive a property type and a value list, wherein the value list represents the one or more geometric elements in the CAD environment;
calculate a first nest level from the value list;
calculate a second nest level from the value list;
calculate a starting nest level from the second nest level;
calculate a level count from the first nest level and the second nest level;
rotate the level count number of members from the starting nest level to a topmost level and pushing down all intervening levels between them; and
store a result of the rotate in the non-transitory computer readable medium storage.

16. The parametric modeling system of claim 15, wherein the calculate a first nest level from the value list further comprises:
traversing recursively through the value list to determine a deepest nest level at which there resides an item that is compatible with the property type.

17. The parametric modeling system of claim 15, wherein the calculate a second nest level from the value list further comprises:
traversing recursively through the value list to determine a deepest nest level at which there resides a literal list that is compatible with the property type.

* * * * *

UNITED STATES PATENT AND TRADEMARK OFFICE
CERTIFICATE OF CORRECTION

| | | |
|---|---|---|
| PATENT NO. | : 8,700,361 B2 | Page 1 of 1 |
| APPLICATION NO. | : 12/725804 | |
| DATED | : April 15, 2014 | |
| INVENTOR(S) | : Brown | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 721 days.

Signed and Sealed this
Eleventh Day of August, 2015

Michelle K. Lee
*Director of the United States Patent and Trademark Office*